United States Patent
Yang et al.

(10) Patent No.: US 7,598,130 B2
(45) Date of Patent: Oct. 6, 2009

(54) METHOD FOR REDUCING LAYOUT-DEPENDENT VARIATIONS IN SEMICONDUCTOR DEVICES

(75) Inventors: Chung-Heng Yang, Hsinchu (TW);
Yi-Ming Sheu, Hsin-Chu (TW);
Sheng-Jier Yang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 128 days.

(21) Appl. No.: 11/529,091

(22) Filed: Sep. 28, 2006

(65) Prior Publication Data
US 2008/0081382 A1   Apr. 3, 2008

(51) Int. Cl.
*H01L 21/00* (2006.01)
(52) U.S. Cl. ..................................... 438/149
(58) Field of Classification Search .............. 438/5, 438/7, 10–11, 16–18, 22–24, 29, 31, 34–36, 438/128–130, 149, 484, 538
See application file for complete search history.

(56) References Cited

U.S. PATENT DOCUMENTS

| 5,525,529 | A | 6/1996 | Guldi |
| 5,960,332 | A | 9/1999 | Michalzik |
| 6,232,185 | B1* | 5/2001 | Wang ........................... 438/266 |
| 6,566,215 | B1* | 5/2003 | Chong et al. .................. 438/305 |
| 6,773,994 | B2* | 8/2004 | Chittipeddi et al. .......... 438/268 |
| 7,176,113 | B1* | 2/2007 | Wong et al. .................. 438/526 |
| 2003/0119237 | A1* | 6/2003 | Chittipeddi et al. .......... 438/199 |
| 2003/0162374 | A1 | 8/2003 | Brown et al. |
| 2003/0228741 | A1 | 12/2003 | Schafbauer et al. |
| 2004/0214379 | A1* | 10/2004 | Lee et al. ...................... 438/149 |
| 2007/0037343 | A1* | 2/2007 | Colombo et al. ............. 438/231 |

* cited by examiner

*Primary Examiner*—Walter L Lindsay, Jr.
*Assistant Examiner*—Andre' C Stevenson
(74) *Attorney, Agent, or Firm*—Slater & Matsil, L.L.P.

(57) ABSTRACT

A method for forming an integrated circuit includes providing a semiconductor substrate, forming a re-implantation blocking layer over the semiconductor substrate, forming a mask over the re-implantation blocking layer, patterning the mask to form an opening, wherein a portion of the re-implantation blocking layer is exposed through the opening, performing an implantation to introduce an impurity into a portion of the semiconductor substrate underlying the opening to form a well region, removing the mask, and removing the re-implantation blocking layer.

19 Claims, 8 Drawing Sheets

METHOD FOR REDUCING LAYOUT-DEPENDENT VARIATIONS IN SEMICONDUCTOR DEVICES

TECHNICAL FIELD

This invention relates generally to integrated circuits, and more particularly to formation processes of well regions in semiconductor substrates.

BACKGROUND

Semiconductor-metal-oxide (MOS) devices, also referred to as transistors, are core devices in the modem integrated circuits. MOS devices are typically formed in well regions, which are doped with p-type or n-type impurities. N-type MOS (NMOS) devices are typically formed in p-type well regions, while p-type MOS (PMOS) devices are typically formed in n-type well regions.

Well regions need to be formed prior to the formation of MOS devices. The formation processes of well regions involve the processes of forming and patterning masks and implanting desired impurities. FIG. 1 illustrates a cross-sectional view of a typical well formation process. Photoresist 6 is formed on substrate 2, through which a portion of semiconductor substrate 2 is exposed. An implantation, which is symbolized by arrows 8, is then performed to introduce impurities into substrate 2, and thus well region 4 is formed.

The conventional well implantation process suffers from well proximity effects. At the time the atoms of the implanted impurities are introduced into well region 4, the impurity atoms are also implanted into photoresist 6. Colliding with the atoms/molecules in photoresist 6, the impurity atoms will have increasingly smaller speeds as they travel in photoresist 6. The collision will also cause the scattering of impurity atoms, particularly the impurity atoms with reduced speeds. For the impurity atoms close to the edges of photoresist 6, there is a chance that they will be scattered out of photoresist 6 and re-implanted into well region 4, wherein the re-implanted atoms are schematically illustrated as arrows 10.

It can be found that the well proximity effects are layout related, which means that the severity of well proximity effects are affected by distance D between neighboring photoresist 6. With a smaller distance D, more impurity atoms are re-implanted per unit area. Conversely, with a greater distance D, less impurity atoms are re-implanted per unit area. The re-implanted atoms cause an increase in the impurity concentration in well region 4. The increased impurity concentration in a channel region 12 of a subsequently formed MOS device adversely affects threshold voltage and drive current.

The impurity re-implantation is affected by various factors, such as distance D, the energy of implanted impurity atoms, and the type of the impurity, etc. It is thus very difficult to model and to compensate for the well proximity effects. Therefore, a method for reducing the layout-related well proximity effects is needed.

SUMMARY OF THE INVENTION

In accordance with one aspect of the present invention, a method for forming an integrated circuit includes providing a semiconductor substrate, forming a re-implantation blocking layer over the semiconductor substrate, forming a mask over the re-implantation blocking layer, patterning the mask to form an opening, wherein a portion of the re-implantation blocking layer is exposed through the opening, performing an implantation to introduce an impurity into a portion of the semiconductor substrate underlying the opening to form a well region, removing the mask, and removing the re-implantation blocking layer.

In accordance with another aspect of the present invention, a method for forming an integrated circuit includes providing a semiconductor substrate, forming a sacrificial layer over the semiconductor substrate, forming a re-implantation blocking layer over the sacrificial layer, forming a photoresist over the re-implantation blocking layer, patterning the photoresist to form an opening, wherein a portion of the re-implantation blocking layer is exposed through the opening, performing an implantation to introduce an impurity into a portion of the semiconductor substrate underlying the opening to form a well region, removing the photoresist, removing the re-implantation blocking layer, performing a well annealing, removing the sacrificial layer, forming a gate dielectric layer on the semiconductor substrate after the step of removing the sacrificial layer, and forming a gate electrode layer on the gate dielectric layer.

In accordance with yet another aspect of the present invention, a method for forming an integrated circuit includes providing a semiconductor substrate, forming a sacrificial layer over the semiconductor substrate, forming a first bottom anti-reflective coating (BARC) over the sacrificial layer, forming a first photoresist over the first BARC, patterning the first photoresist to form a first opening, wherein a portion of a top surface of the first BARC is exposed through the first opening, performing a first implantation to introduce an impurity into a portion of the semiconductor substrate underlying the first opening to form a first well region, removing the photoresist, removing the first BARC, forming a second BARC over the sacrificial layer, forming a second photoresist over the second BARC, patterning the second photoresist to form a second opening, wherein a portion of a top surface of the second BARC is exposed through the second opening, performing a second implantation to introduce an impurity into a portion of the semiconductor substrate underlying the additional opening to form an additional well region, removing the second photoresist, removing the second BARC, performing a well annealing, removing the sacrificial layer, forming a gate dielectric layer on the semiconductor substrate, and forming a gate electrode layer on the gate dielectric layer.

The advantageous features of the present invention include reduced well proximity effects and increased MOS device drive currents.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for reducing layout-related well proximity effects (WPE) is provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 1:
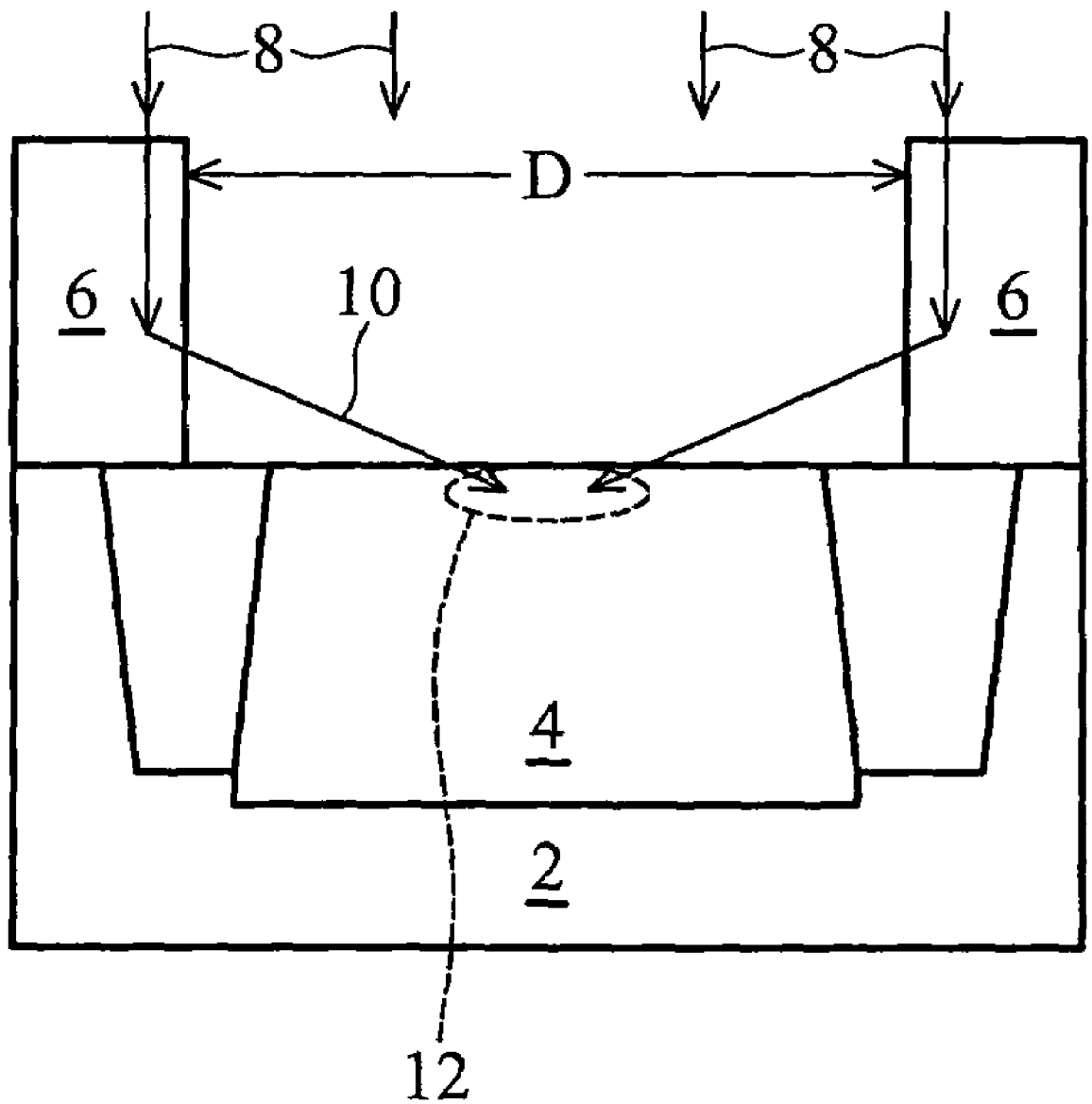
FIG. 1 illustrates a cross-sectional view of a conventional formation process of a well region.
Figure 2:
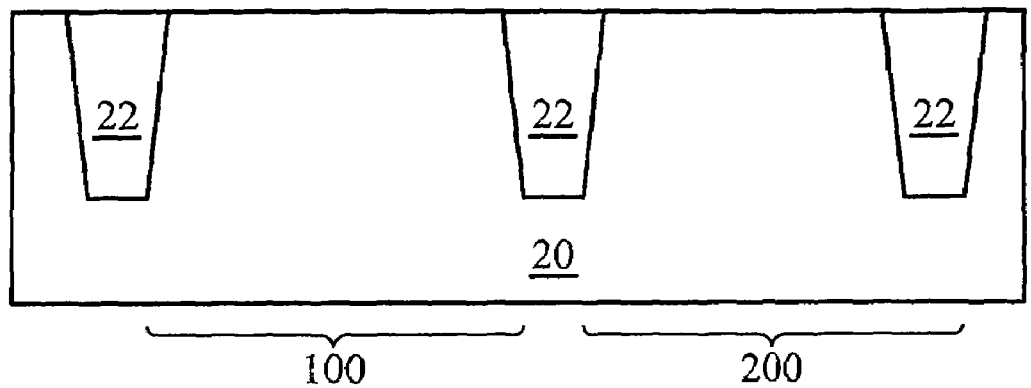
FIGS. 2 through 8 are cross-sectional views of intermediate stages in a first embodiment for forming well regions, wherein a re-implantation blocking layer is used to prevent the re-implantation of impurity atoms into channel regions.

FIGS. 2 through 8 illustrate a first embodiment of the present invention. Referring to FIG. 2, substrate 20 is provided. Substrate 20 is preferably a bulk silicon substrate. Alternatively, substrate 20 comprises SiGe or other semiconductor materials such as group III and group IV elements. Substrate 20 may also have a composite structure such as silicon-on-insulator (SOI). Shallow trench isolation (STI) regions 22 are formed in substrate 20 to isolate device regions. As is known in the art, STI regions 22 may be formed by etching substrate 20 to form recesses, and then filling the recesses with dielectric materials, for example, high-density plasma (HDP) oxides. Substrate 20 includes region 100 and region 200, in which well regions will be formed in different implantation steps. In a first exemplary embodiment, region 100 is a PMOS region, in which an n-well region will be formed, while region 200 is an NMOS region, in which a p-well region will be formed. In a second exemplary embodiment, region 100 is a low-voltage device region, while region 200 is a high-voltage device region.

Figure 3:
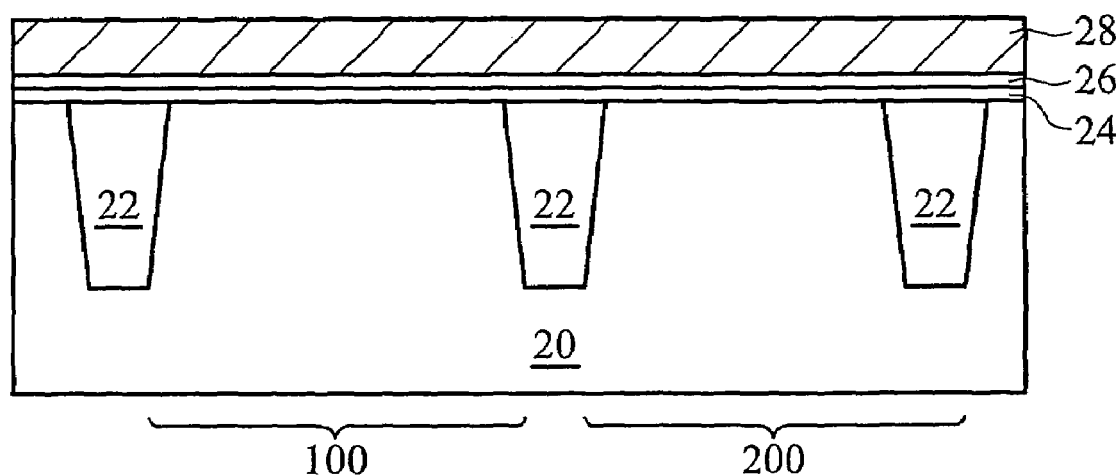

FIG. 3 illustrates the formation of stacked layers, including sacrificial layer 24, etch stop layer 26 and re-implantation blocking layer 28. Sacrificial layer 24 is preferably formed of nitrides or oxides, such as SiN, SiO2, and combinations thereof. The preferred thickness is between about 30 Å and about 300 Å, and more preferably about 90 Å. The preferred methods for forming sacrificial layer 24 include thermal oxidation, rapid thermal oxidation (RTO), chemical vapor deposition (CVD) (of oxides), and the like.

In one embodiment, etch stop layer 26 is a silicon nitride layer, and preferably has a thickness of between about 20 Å and about 100 Å, more preferably about 40 Å. In alternative embodiments, etch stop layer 26 comprises materials having different etching characteristics from the overlying re-implantation blocking layer 28, such as oxides or materials that are commonly used as bottom anti-reflective coating (BARC) such as silicon oxynitride, and combinations thereof.

Layer 28 is a layer for blocking the re-implanted impurity atoms, and thus is referred to as a re-implantation blocking layer. The thickness of re-implantation blocking layer 28 is preferably thick enough to block re-implanted impurity atoms from reaching a perspective channel region of the subsequently formed MOS device, but thin enough so as not to block directly implanted impurity atoms from forming a well region. In an embodiment, re-implantation blocking layer 28 is formed of tetraethyl ortho-silicate (TEOS), and preferably has a thickness of greater than about 500 Å, and more preferably between about 500 Å about 1500 Å. In other embodiments, re-implantation blocking layer 28 comprises other materials such as silicon nitride, oxides, and even poly-silicon. It is to be realized that the preferred thickness of re-implantation blocking layer 28 is affected by various factors, such as the energy of the implantation, the desired depth of the well region, and the type of implanted impurity. One skilled in the art will be able to find optimum thicknesses through experiments.

It is appreciated that layers 26 and 28 may have different combination of structures and materials, for example, layers 26 and 28 may be replaced by either a single layer or more than two layers, as long as they perform the function of blocking the re-implantation of impurities. In a first exemplary embodiment, layers 26 and 28 are replaced by a single silicon nitride layer. In a second exemplary embodiment, layer 28 comprises silicon nitride, while layer 26 is a thin etch stop layer comprises oxide. Layers 26 and 28 may be formed using commonly used techniques, such as plasma enhanced chemical vapor deposition (PECVD), low-pressure chemical vapor deposition (LPCVD), sub-atmospheric chemical vapor deposition (SACVD), and the like.

The blocking effects of re-implantation blocking layer 28 are related to its material and the type of implanted atoms. Experiment results have revealed that if boron is implanted for forming a p-well region, a silicon/polysilicon layer has better blocking effects than an oxide layer, and a silicon nitride layer has better blocking effects than a silicon (poly-silicon) layer. If phosphorous is implanted for forming an n-well region, an oxide layer has better blocking effects than a silicon (polysilicon) layer, and a silicon nitride layer has better blocking effects than an oxide layer. Therefore, a silicon nitride layer is a good candidate for blocking the re-implantation of both p-type and n-type impurities.

Figure 4A:
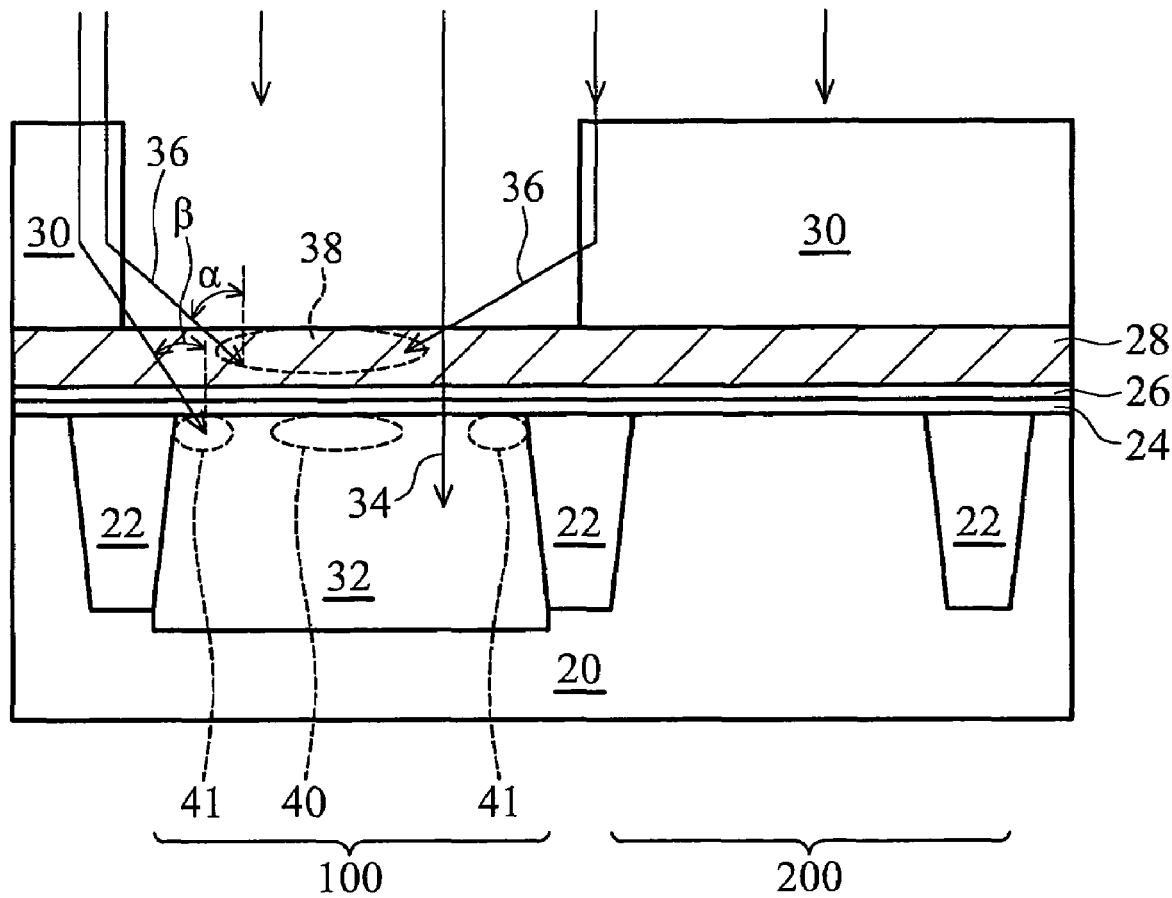

FIG. 4A illustrates the formation of mask 30 and well region 32. Mask 30 is preferably a photoresist, although other commonly used mask materials may also be used. Mask 30 is patterned to mask region 200 while region 100 is exposed. As is known in the art, the formation of well region 32 may be performed by implanting impurities, such as phosphorous.

Atoms that are directly implanted into well region 32, which are symbolized by arrow 34 have enough energy to penetrate the stacked layers 24, 26 and 28 to form well region 32. The re-implanted atoms (refer to arrows 36) have lower energies due to the collisions in mask 30. In addition, the scattered atoms have incident angles a greater than zero, thus have even lower speeds in the vertical direction. Particularly, in order to reach channel region 40, which typically resides in the middle of the neighboring mask 30, the re-implanted atoms need to have a greater angle α, resulting in an even smaller penetration distance. As a result, the re-implanted atoms, particularly those atoms that may go into channel region 40, will stop in re-implantation blocking layer 28, and possibly in layers 24 and 26. Region 38 schematically illustrates a region that the re-implanted atoms 36 may reside. Since channel region 40 tends to be lightly doped, the re-implanted atoms may significantly change the impurity concentration in channel region 40. Therefore, the blocking of the re-implanted atoms will significantly improve the performance of the resulting MOS device.

The re-implanted atoms that have smaller incident angles β tend to have greater vertical speeds, thus they are more likely to penetrate re-implantation blocking layer 28. However, they are likely to be re-implanted into source/drain regions 41 due to the smaller angles β. Since source/drain regions of MOS devices are typically heavily doped, the effects of the re-implanted atoms in regions 41 are of a lesser concern to the performance of the resulting MOS devices.

Figure 4B:
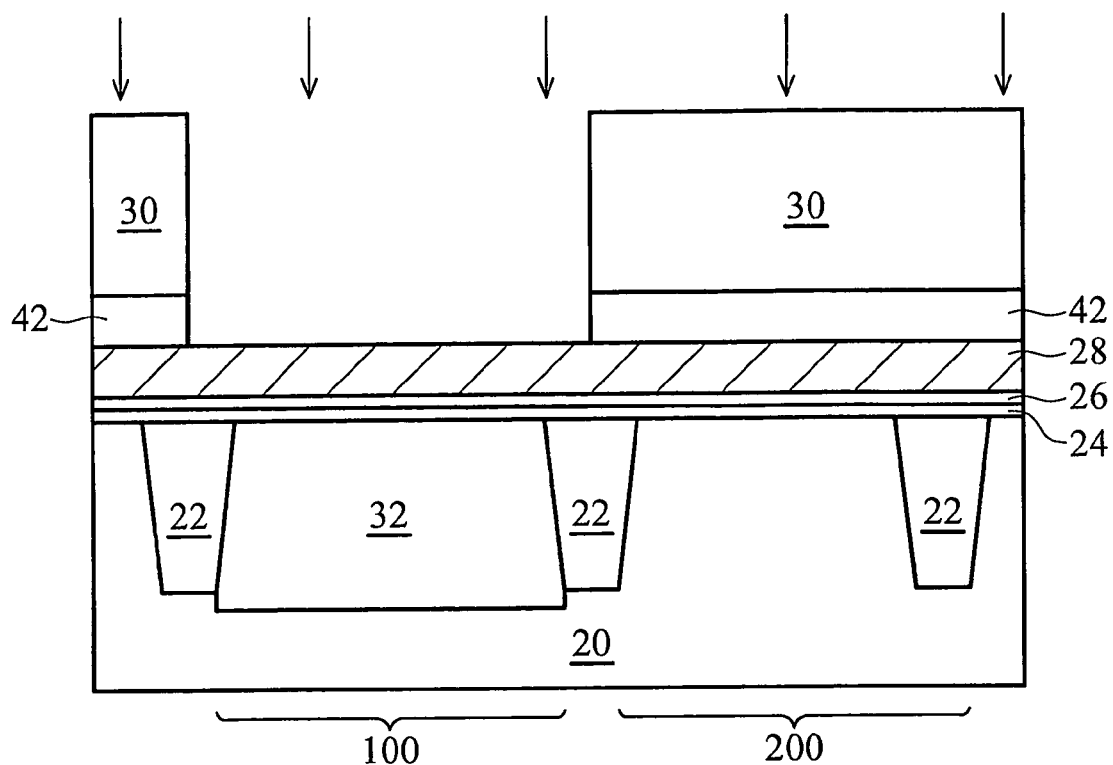

BARC is often used along with photoresists to reduce the reflection from the layers underlying photoresists. FIG. 4B illustrates an embodiment, having BARC 42 formed underlying photoresist 30. Typically, BARC is also etched along with photoresist 30.

Figure 5:
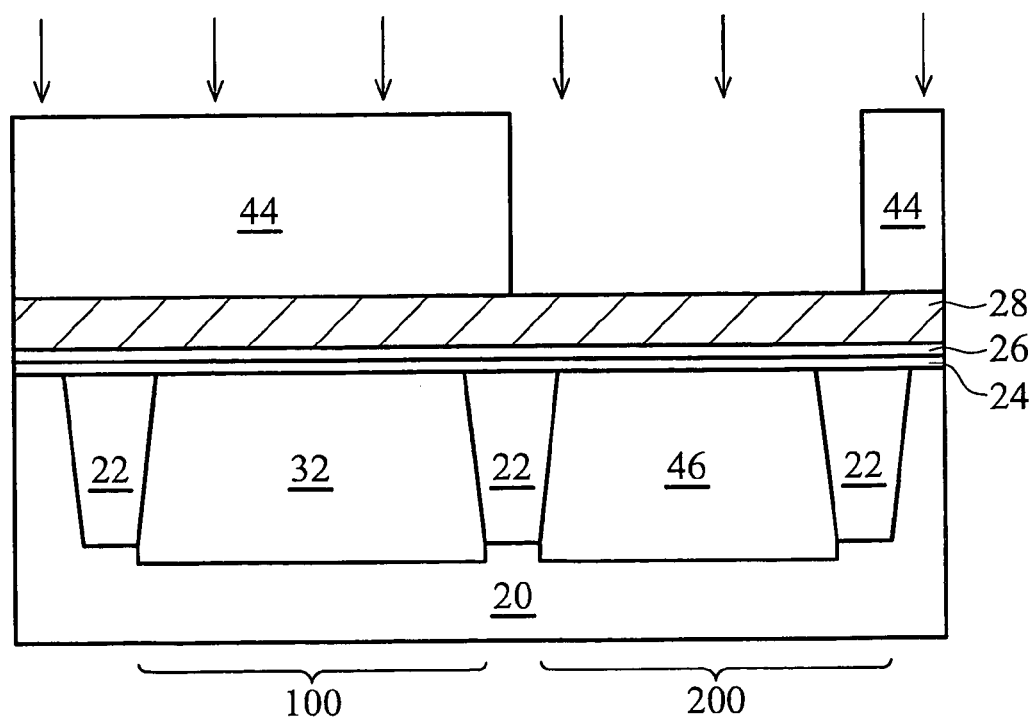

Referring to FIG. 5, mask 30 is removed. An additional mask 44 is formed, which covers region 100 while exposes region 200. Similar to the process illustrated in FIGS. 4A and 4B, well region 46 may be formed by an implantation, and stacked layers 24, 26 and 28 will block the re-implantation of impurity atoms.

Figure 6:
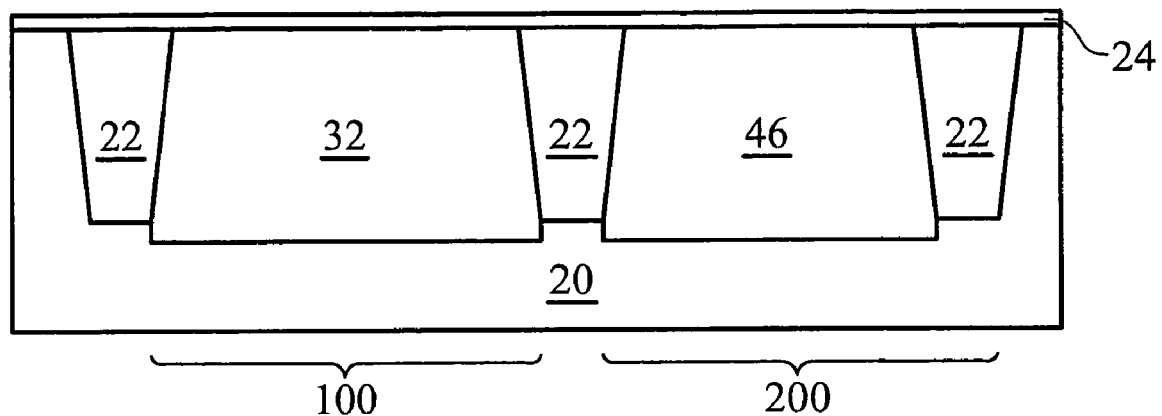

Re-implantation blocking layer 28 and etch stop layer 26 are then removed, as is illustrated in FIG. 6. In the exemplary embodiment wherein layers 26 and 28 are formed of silicon nitride and TEOS, respectively, re-implantation blocking layer 28 may be removed using diluted phosphoric acid, wherein etch stop layer 26 stops the removal process. Etch stop layer 26 may then be removed using HF, and sacrificial layer 24 stops the etching of etch stop layer 26.

Figure 7:
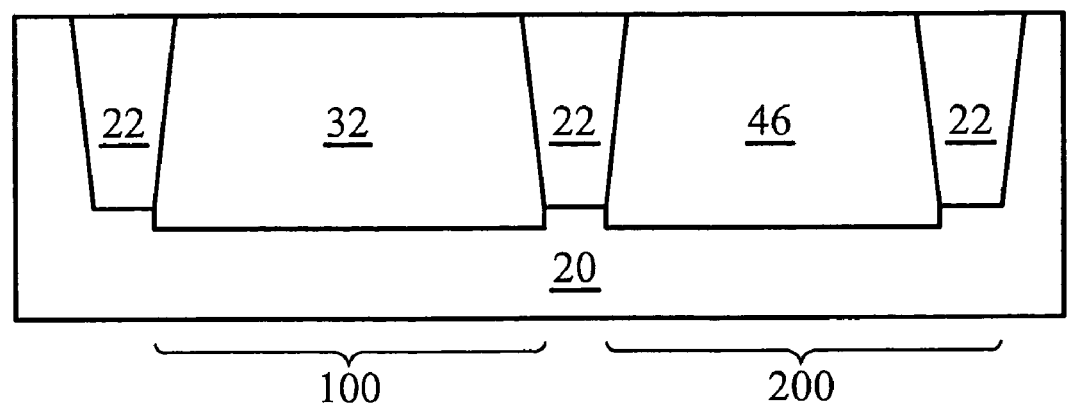

A well annealing is then performed, for example, by a rapid thermal anneal (RTA). Sacrificial layer 24 is then removed, as illustrated in FIG. 7. Alternatively, the well annealing may be performed before the removal of layers 26 and 28. In this case, if re-implantation blocking layer 28, which is a relatively thick layer, has an inherent stress, a stress may be memorized by substrate 20 even after the removal of layers 26 and 28. Such memorized stress needs to be taken into consideration since it will affect the performance of the subsequently formed MOS devices. As is known in the art, the inherent stress in a silicon nitride layer is partially determined by the respective process conditions in its formation, such as temperature, power, etc. In one embodiment, the process conditions for forming re-implantation blocking layer 28 are adjusted so that re-implantation blocking layer 28 is substantially free from stress. In other embodiments, re-implantation blocking layer 28 has a desired stress for the subsequently formed MOS devices.

Figure 8:
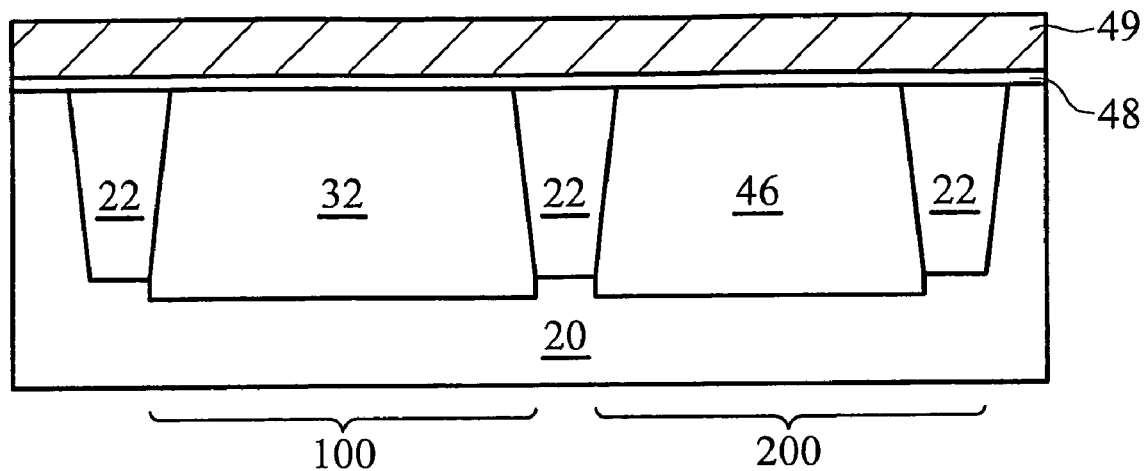

FIG. 8 illustrates the formation of gate dielectric layer 48 and gate electrode layer 49. Gate dielectric layer 48 may include commonly used dielectric materials such as oxides, nitrides, oxynitrides, oxycarbide, and combinations thereof. Gate electrode layer 49 may include doped polysilicon, metals, metal silicides, metal nitrides, and combinations thereof. Layers 48 and 49 are then patterned to form gate stacks for MOS devices (not shown). Further processes are then performed to finish the formation of the MOS devices. The formation processes of the MOS devices are known in the art, thus are not repeated herein.

Figure 9:
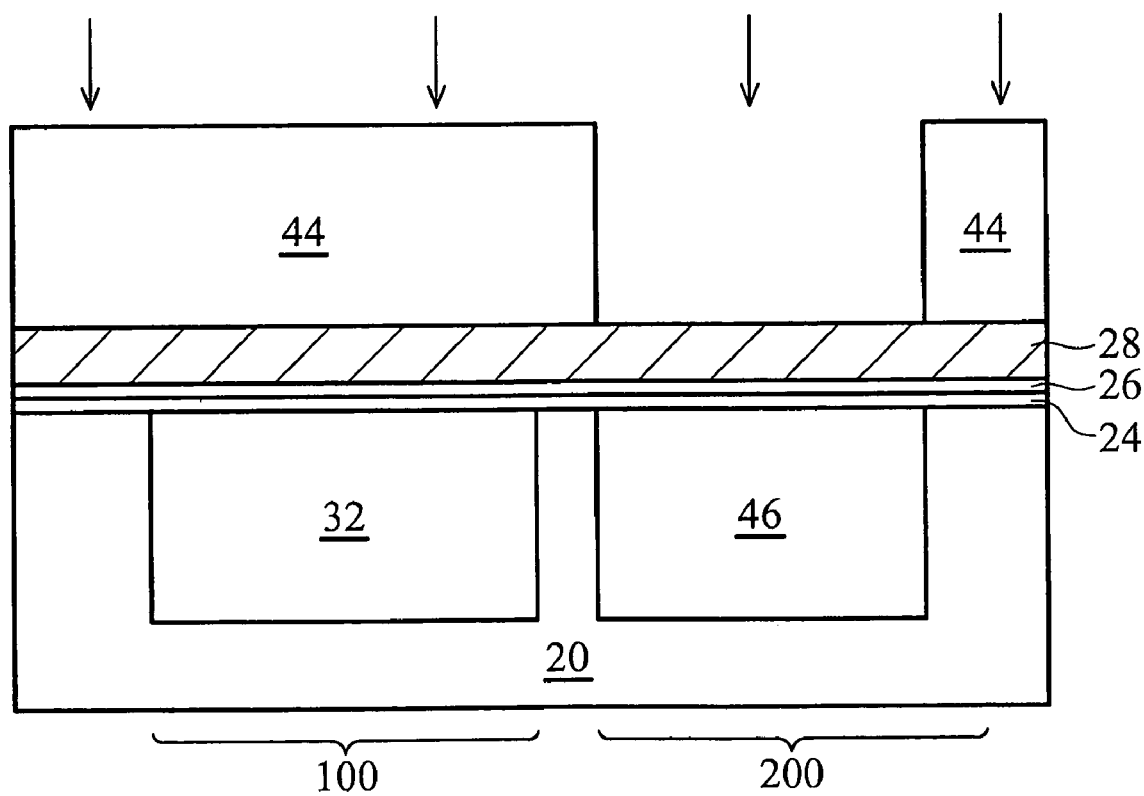
FIGS. 9 and 10 are cross-sectional views of intermediate stages in a second embodiment for forming well regions, wherein shallow trench isolation regions are formed after the formation of well regions.
Figure 10:
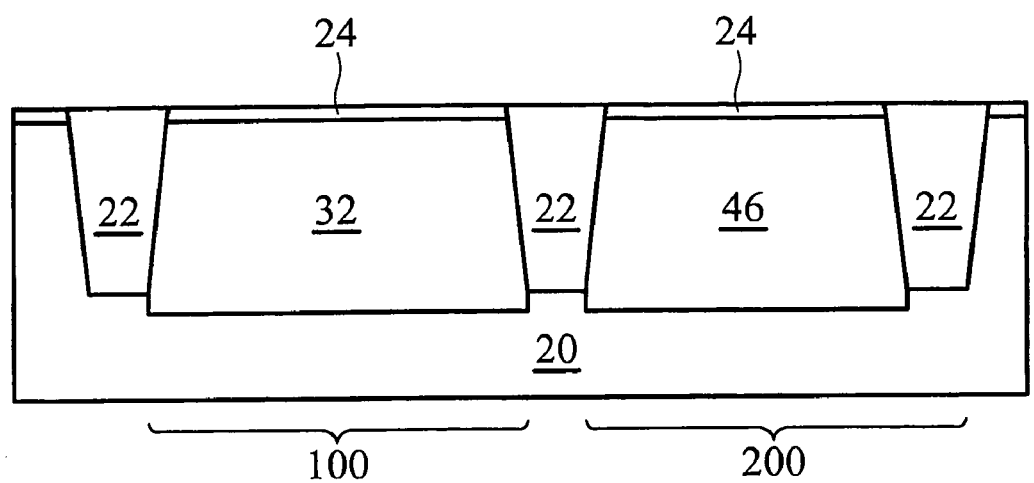

In a second embodiment of the present invention, as illustrated in FIGS. 9 and 10, STI regions 22 (refer to FIG. 5) are formed after the formation of well regions 32 and 46. A brief formation process is described as follows. Referring to FIG. 9, substrate 20 is provided. Sacrificial layer 24, etch stop layer 26 and re-implantation blocking layer 28 are formed on substrate 20. A mask (not shown) is then formed with an opening (not shown) exposing a portion of substrate 20. Well region 32 is then formed by implantation. The mask is removed, and an additional mask 44 is formed. Well region 46 is formed by implanting through an opening in mask 44. Mask 46 is then removed. As has been discussed in the preceding paragraphs, re-implantation blocking layer 28 and etch stop layer 26 prevent the re-implantation of impurity atoms into substrate 20.

In FIG. 10, re-implantation blocking layer 28 and etch stop layer 26 are removed. STI regions 22 are then formed, followed by a well annealing. In subsequent steps, sacrificial layer 24 is removed. A gate dielectric layer and a gate electrode layer are then formed.

Figure 11:
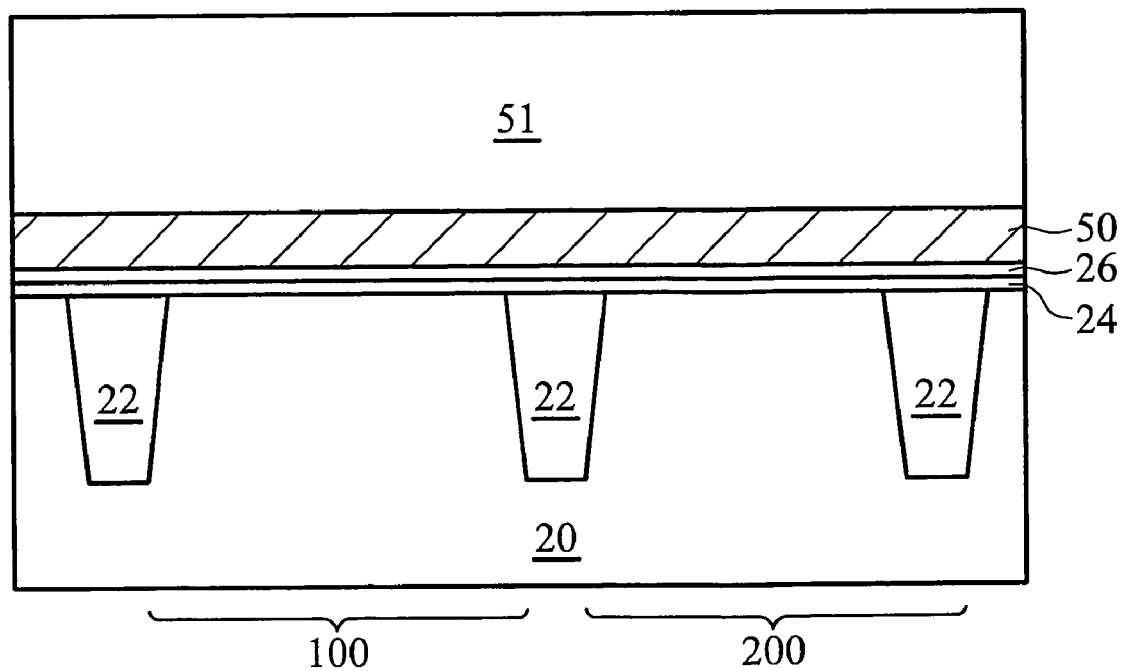
FIGS. 11 through 13 are cross-sectional views of intermediate stages in a third embodiment for forming well regions, wherein bottom anti-reflective coatings are used as re-implantation blocking layers.
Figure 12:
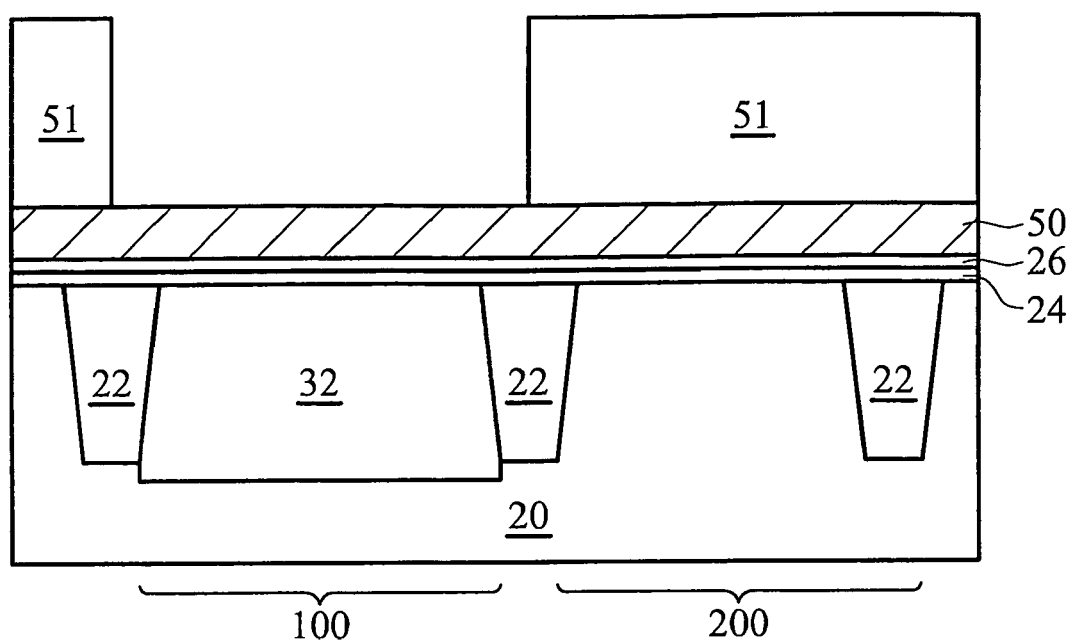

In a third embodiment of the present invention, BARCs are used as re-implantation blocking layer 28. The initial steps are similar to the steps illustrated in FIGS. 2 and 3. In FIG. 11, BARC 50 is formed on the structure shown in FIG. 3, followed by the formation of photoresist 51. BARC 50 may be formed of commonly used BARC materials such as SiON, SiN, and the like. Different from conventional photoresist formation processes, only photoresist 51 is patterned, while BARC 50 is not patterned, as illustrated in FIG. 12. Subsequently, an implantation is performed to form well region 32, wherein BARC 50 acts as the re-implantation blocking layer. The thickness of BARC 50 may need to be adjusted to suit the requirement of blocking the re-implantation and the requirement for reducing reflection during the exposure of photoresist 51. After the formation of well region 32, BARC 50 and photoresist 51 are removed.

Figure 13:
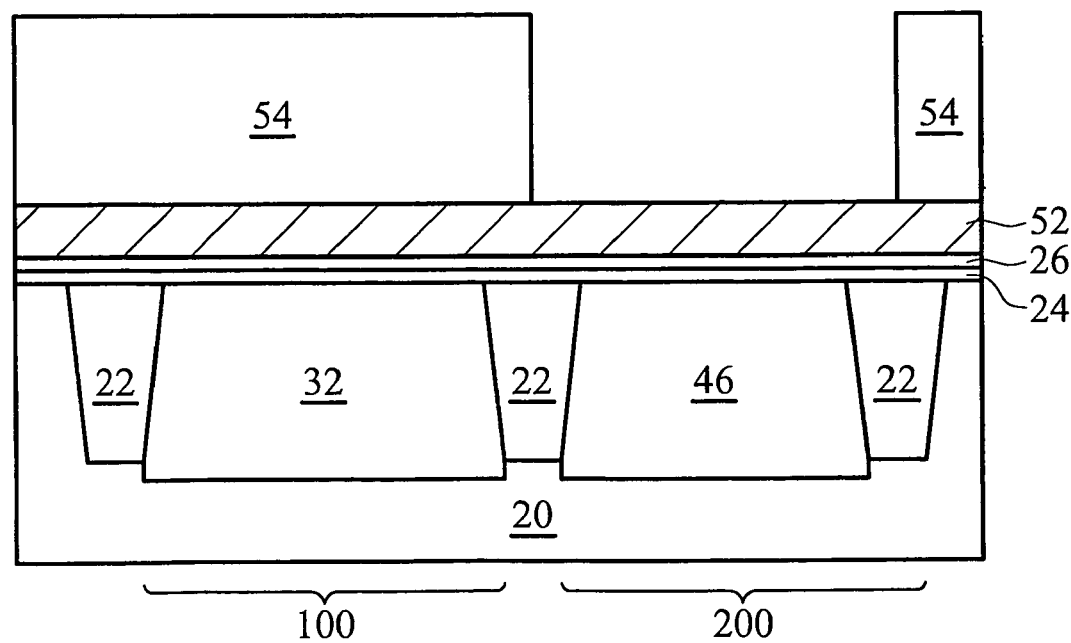

Referring to FIG. 13, BARC 52 is formed, followed by the formation of photoresist 54. BARC 52 may be formed of essentially the same material as BARC 50 (refer to FIG. 12). Photoresist 54 is then patterned, exposing BARC 52. Subsequently, an implantation is performed to form well region 46, wherein BARC 52 acts as the re-implantation blocking layer. After the formation of well region 46, BARC 52 and photoresist 54 are removed.

An advantageous feature of the third embodiment is that BARCs 50 and 52 may comprise different materials and/or having different thicknesses, suiting customized needs for forming different well regions. However, extra process steps for forming and removing an additional BARC are involved.

Experiment results have revealed that the embodiments of the present invention have the effects of increasing drive currents of MOS devices. Three sample PMOS devices have been formed using 65 nm technology for comparison purposes. In a first PMOS device, the n-well region is large enough, so that the re-implanted impurity atoms cannot reach the channel region, and thus WPE effects can be ignored. In a second PMOS device, an n-well region is formed to a minimum width allowed by the formation technology, which is about 160 nm, and no re-implantation blocking layer is formed in the formation of the respective n-well region. A third PMOS device is similar to the second PMOS device, except a re-implantation blocking layer is formed. It is found that the drive current of the second PMOS device is degraded about 10.8 percent compared to the first PMOS device. The third PMOS device has a same drive current as the first PMOS device, indicating that the WPE has been substantially eliminated by using the embodiments of the present invention.

Similar experiments are performed to form a first, a second and a third sample NMOS device, whose well regions have essentially the same dimensions (and are formed using essentially the same methods) as the well regions of the respective first, second and third PMOS devices. Experiment results have indicated that the drive current of the second MOS device has a 13.2 percent degradation compared to the first NMOS device. The drive current of the third MOS device only has an 8.3 percent degradation compared to the first NMOS device.

The embodiments of the present invention have the advantageous feature of reducing, and possibly substantially eliminating, layout-related well proximity effects. As a result, greater dosage can be implanted to well regions without the concern of degrading MOS devices. Better isolation between MOS devices can thus be achieved. The embodiments of the present invention of the present invention are simple to implement, and are fully compatible with the existing integration circuit formation processes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit, the method comprising:
    providing a semiconductor substrate;
    forming a re-implantation blocking layer over the semiconductor substrate;
    forming a mask over the re-implantation blocking layer;
    patterning the mask to form an opening, wherein a portion of the re-implantation blocking layer is exposed through the opening;
    performing an implantation to introduce an impurity into a portion of the semiconductor substrate underlying the opening to form a well region;
    removing the mask; and
    removing the re-implantation blocking layer.

2. The method of claim 1 further comprising:
    forming a sacrificial layer over the semiconductor substrate and underlying the re-implantation blocking layer; and
    removing the sacrificial layer after the step of removing the re-implantation blocking layer and before forming a gate dielectric layer.

3. The method of claim 2 further comprising a well annealing between the steps of removing the re-implantation blocking layer and the step of removing the sacrificial layer.

4. The method of claim 2 further comprising forming an etch stop layer between the re-implantation blocking layer and the sacrificial layer.

5. The method of claim 1 further comprising:
    forming an additional mask over the re-implantation blocking layer after the step of removing the mask;
    patterning the additional mask to form an additional opening, wherein an additional portion of the re-implantation blocking layer is exposed through the additional opening; and
    performing an additional implantation to introduce an impurity into an additional portion of the semiconductor substrate underlying the additional opening to form an additional well region.

6. The method of claim 1, wherein the re-implantation blocking layer is a bottom anti-reflective coating layer.

7. The method of claim 1 further comprising a well annealing before the step of removing the mask.

8. The method of claim 1, wherein the re-implantation blocking layer has a thickness of greater than about 500 Å.

9. The method of claim 1, wherein the re-implantation blocking layer comprises a material selected from the group consisting essentially of tetraethyl ortho-silicate (TEOS), silicon nitride, and combinations thereof.

10. The method of claim 1, wherein the mask comprises photoresist.

11. A method for forming an integrated circuit, the method comprising:
    providing a semiconductor substrate;
    forming a sacrificial layer over the semiconductor substrate;
    forming a re-implantation blocking layer over the sacrificial layer;
    forming a photoresist over the re-implantation blocking layer;
    patterning the photoresist to form an opening, wherein a portion of the re-implantation blocking layer is exposed through the opening;
    performing an implantation to introduce an impurity into a portion of the semiconductor substrate underlying the opening to form a well region;
    removing the photoresist;
    removing the re-implantation blocking layer;
    performing a well annealing;
    removing the sacrificial layer;
    forming a gate dielectric layer on the semiconductor substrate after the step of removing the sacrificial layer; and
    forming a gate electrode layer on the gate dielectric layer.

12. The method of claim 11, wherein the step of well annealing is performed before the step of removing the re-implantation blocking layer.

13. The method of claim 11, wherein the re-implantation blocking layer is an anti-reflective coating.

14. The method of claim 11, wherein the re-implantation blocking layer comprises a material selected from the group consisting essentially of tetraethyl ortho-silicate (TEOS), silicon nitride, and combinations thereof.

15. The method of claim 11, wherein the re-implantation blocking layer has a thickness of greater than about 500 Å.

16. The method of claim 11 further comprising:
    forming an additional photoresist over the re-implantation blocking layer after the step of removing the photoresist;
    patterning the additional photoresist to form an additional opening, wherein an additional portion of the re-implantation blocking layer is exposed through the additional opening; and
    performing an additional implantation to introduce an impurity into an additional portion of the semiconductor substrate underlying the additional opening to form an additional well region.

17. A method for forming an integrated circuit, the method comprising:
    providing a semiconductor substrate;
    forming a sacrificial layer over the semiconductor substrate;
    forming a first bottom anti-reflective coating (BARC) over the sacrificial layer;
    forming a first photoresist over the first BARC;
    patterning the first photoresist to form a first opening, wherein a portion of a top surface of the first BARC is exposed through the first opening;
    performing a first implantation to introduce an impurity into a portion of the semiconductor substrate underlying the first opening to form a first well region;
    removing the photoresist;

removing the first BARC;
forming a second BARC over the sacrificial layer;
forming a second photoresist over the second BARC;
patterning the second photoresist to form a second opening, wherein a portion of a top surface of the second BARC is exposed through the second opening;
performing a second implantation to introduce an impurity into a portion of the semiconductor substrate underlying the additional opening to form an additional well region;
removing the second photoresist;
removing the second BARC;
performing a well annealing;
removing the sacrificial layer;
forming a gate dielectric layer on the semiconductor substrate; and
forming a gate electrode layer on the gate dielectric layer.

18. The method of claim 17 further comprising forming an etch stop layer on the sacrificial layer.

19. The method of claim 17, wherein the first BARC and the second BARC have different thicknesses.

* * * * *